United States Patent
Chau et al.

[19]

[11] Patent Number: 6,103,635
[45] Date of Patent: *Aug. 15, 2000

[54] TRENCH FORMING PROCESS AND INTEGRATED CIRCUIT DEVICE INCLUDING A TRENCH

[75] Inventors: Duc Q Chau, San Jose; Brian Sze-Ki Mo, Fremont, both of Calif.; Teina L. Pardue, West Jordan, Utah

[73] Assignee: Fairchild Semiconductor Corp., South Portland, Me.

[*] Notice: This patent issued on a continued prosecution application filed under 37 CFR 1.53(d), and is subject to the twenty year patent term provisions of 35 U.S.C. 154(a)(2).

[21] Appl. No.: 08/959,197

[22] Filed: Oct. 28, 1997

[51] Int. Cl.$^7$ .................................................. H01L 21/76
[52] U.S. Cl. .......................... 438/739; 438/424; 438/756
[58] Field of Search ................................. 438/424, 425, 438/426, 427, 428, 429, 430–438, 761, 421, 756, 739

[56] References Cited

U.S. PATENT DOCUMENTS

| | | | |
|---|---|---|---|
| 4,337,115 | 6/1982 | Ikeda et al. ............................ 156/659.1 |
| 4,767,722 | 8/1988 | Blanchard ................................ 437/41 |
| 4,893,160 | 1/1990 | Blanchard .............................. 357/23.4 |
| 4,967,245 | 10/1990 | Cogan et al. .......................... 357/23.4 |
| 5,002,632 | 3/1991 | Loewenstein et al. ................. 156/643 |
| 5,072,226 | 12/1991 | Bulucea et al. ........................ 357/23.4 |
| 5,100,822 | 3/1992 | Mitani ...................................... 437/48 |
| 5,168,331 | 12/1992 | Hamza Yilmaz ..................... 257/331 |
| 5,258,332 | 11/1993 | Horioka et al. ......................... 437/228 |
| 5,298,442 | 3/1994 | Bulucea .................................... 437/40 |
| 5,316,959 | 5/1994 | Kwan et al. .............................. 437/40 |
| 5,341,011 | 8/1994 | Hshieh et al. .......................... 257/330 |
| 5,410,170 | 4/1995 | Bulucea et al. ........................ 257/332 |
| 5,430,324 | 7/1995 | Bencuya ................................. 257/495 |
| 5,434,447 | 7/1995 | Miyashita et al. ..................... 257/514 |
| 5,468,982 | 11/1995 | Hshieh et al. .......................... 257/331 |
| 5,474,943 | 12/1995 | Hshieh et al. ............................ 437/40 |
| 5,532,179 | 7/1996 | Chang et al. ............................. 437/40 |
| 5,558,313 | 9/1996 | Hshieh et al. .......................... 257/342 |
| 5,578,518 | 11/1996 | Koike ....................................... 437/67 |
| 5,578,851 | 11/1996 | Hshieh et al. .......................... 257/330 |
| 5,592,005 | 1/1997 | Floyd et al. ............................ 257/331 |
| 5,597,765 | 1/1997 | Yilmaz et al. .......................... 437/203 |
| 5,605,852 | 2/1997 | Bencuya ................................... 437/40 |
| 5,614,751 | 3/1997 | Yilmaz et al. .......................... 257/394 |
| 5,753,554 | 5/1998 | Park ........................................ 438/296 |
| 5,753,961 | 5/1998 | Tsuchiaki .............................. 257/510 |
| 5,766,823 | 6/1998 | Fumitomo .............................. 438/761 |
| 5,858,857 | 1/1999 | Ho ........................................ 438/424 |
| 5,863,827 | 1/1999 | Joyner ................................... 438/425 |
| 5,880,004 | 3/1999 | Ho ........................................ 438/424 |

OTHER PUBLICATIONS

S. Wolf and R.N. Tauber, Silicon Processing for the VLSI Era, vol. 1, Lattice Press, p. 541, 1986.
S. Wolf, Silicon Processing for the VLSI Era, vol. 2, Lattice Press, pp. 51, 52, 54, 331.
Frank Goodenough, *Dense MOSFET Enables Portable Power Control*, "Tech Insights", *Electronic Design*, Apr. 14, 1997.

*Primary Examiner*—Olik Chaudhuri
*Assistant Examiner*—Anh Duy Mai
*Attorney, Agent, or Firm*—Townsend and Townsend and Crew LLP

[57] ABSTRACT

A process for forming a trench in a semiconductor material is provided. The process includes (a) providing a semiconductor substrate, a first mask layer adjacent the surface of the semiconductor substrate, and a second mask layer adjacent the surface of the first mask layer, the second mask layer defining a first open area and the first mask layer defining a second open area that is larger than the first open area and aligned therewith in a manner so that in the area of the openings the first mask layer is undercut with respect to the second mask layer; and (b) removing a portion of the semiconductor substrate through the open area defined by the second mask layer to form a trench in said semiconductor substrate. An IC device formed using the process is also provided.

11 Claims, 6 Drawing Sheets

TRENCH FORMING PROCESS AND INTEGRATED CIRCUIT DEVICE INCLUDING A TRENCH

BACKGROUND OF THE INVENTION

The present invention relates to processes for forming a trench in a semiconductor material and to integrated circuit (IC) and memory devices that include such trenches.

In the semiconductor industry, trenches are commonly formed in semiconductor materials such as silicon wafers, as an initial step in the formation of various devices used in integrated circuits, for example trench DMOS, capacitors for memory and isolation for IC. Trenches are typically formed by applying a mask, such as photoresist, to the surface of the semiconductor material, and etching the portion of the semiconductor material that is not covered by the mask to remove some of the exposed semiconductor material. The length and width of the trench are defined by the dimensions of the open area in the mask, while the depth of the trench is generally defined by the etch parameters.

The resulting trenches often have sharp top and bottom corners, as shown in FIG. 1. (The term "top corner", as used herein, refers to the top edges 10 of the trench 12 at the junction of the top surface 11 of the semiconductor material and the sidewalls 16 of the trench 12, while the term "bottom corner" refers to the corners 14 that are at the junction of the sidewalls 16 of the trench 12 and the floor 18 of the trench 12.) These sharp corners are undesirable for several reasons. For example, when a gate oxide is formed on the surface of the trench, the oxide will tend to form unevenly, with a thinner oxide layer at the sharp corners. This uneven oxidation can result in high electric field, early gate oxide rupture, and high leakage current. Additionally, sharp corners tend to cause defects in the integrated circuit.

Thus, there has been an ongoing effort in the semiconductor industry to provide a trench-forming process that would form smoothly rounded top and bottom corners, as shown in FIG. 1a. While it has been possible to obtain some rounding of the bottom corners by controlling etch chemistry and parameters, top corner rounding has remained difficult to achieve.

SUMMARY OF THE INVENTION

The inventors have found that, by using a multi-layer mask having an undercut layer adjacent the surface of the semiconductor material, a trench can be formed having exceptionally smoothly rounded top corners. In preferred processes, the process parameters are controlled to provide rounded bottom corners as well.

The present invention features a process for forming a trench in a semiconductor material including providing a semiconductor substrate, a first mask layer adjacent the surface of the semiconductor substrate, and a second mask layer adjacent the surface of the first mask layer. The second mask layer defines a first open area and the first mask layer defines a second open area larger than the first area and aligned therewith in a manner so that, in the area of the openings, the first mask layer is undercut with respect to the second mask layer. The process further includes removing a portion of the semiconductor substrate through the open area defined by the second mask layer to form a trench in the semiconductor substrate.

In preferred embodiments, the process includes one or more of the following features. An oxide layer is applied to the semiconductor substrate and a photoresist to the oxide layer. The oxide layer is wet etched to provide the undercut. The undercut is provided by etching the first and second mask layers with a single etchant, and forming the first and second mask layers of materials having relative selectivities selected to cause the first mask layer to be etched faster than the second mask layer by the etchant. The portions of the substrate are removed to form the trench by etching the semiconductor substrate using a reactive ion etch. Chlorine and argon are selected as ions for use in the reactive ion etch. The first and second mask layers are removed after the trench is formed. After the reactive ion etch, the surface of the trench is smoothed with remote plasma isotropic etch.

In another aspect, the invention features an integrated circuit device including: (a) a silicon substrate; and (b) a trench formed in the silicon substrate, the trench including top corners having an outside radius of curvature of from about 30 to 100 nm.

Other features and advantages of the invention will be apparent from the description of preferred embodiments thereof, taken together with the drawings, and from the claims.

DETAILED DESCRIPTION OF THE PREFERRED EMBODIMENTS

Figure 2:
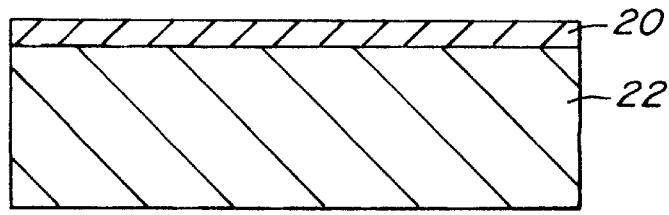
FIGS. 2–2f schematically illustrate the steps in a trench forming process according to one aspect of the invention.
Figure 2A:
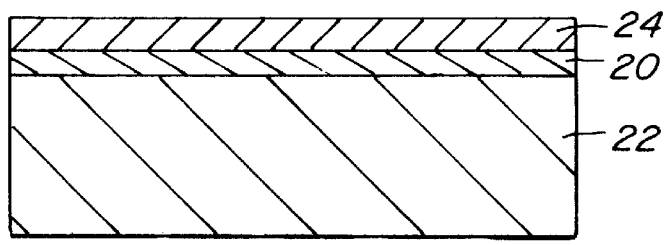
Figure 2B:
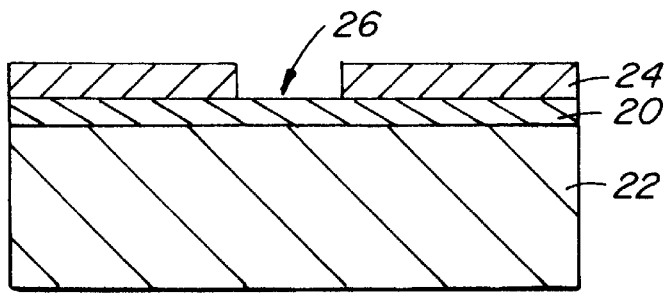
Figure 2C:
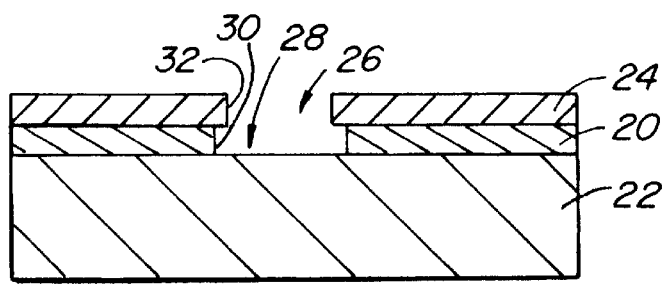
Figure 2D:
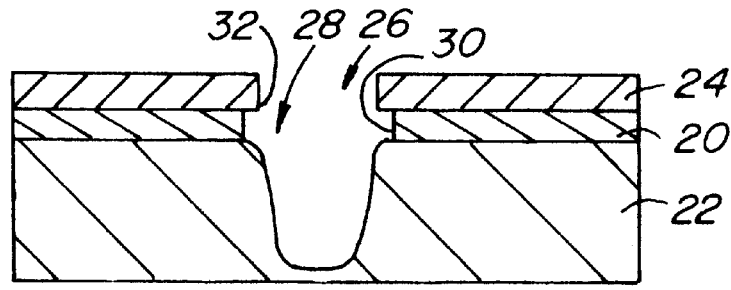
Figure 2E:
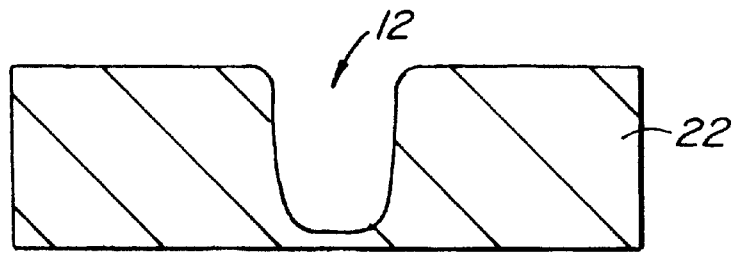
Figure 2F:
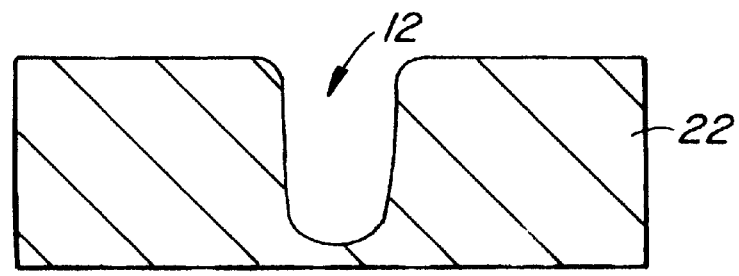
Figure 3:
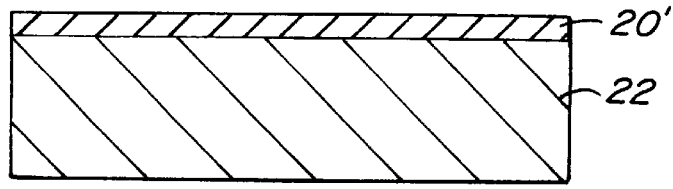
FIGS. 3–3f schematically illustrate an alternative process for forming the undercut mask (FIG. 2c) used in the process of FIGS. 2–2f.
Figure 3A:
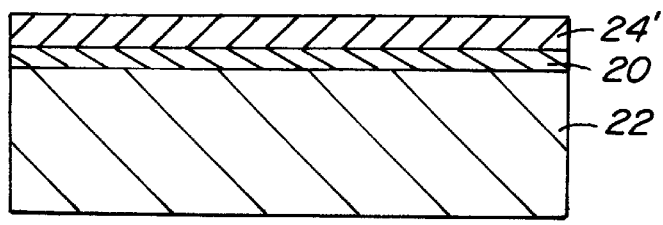
Figure 3B:
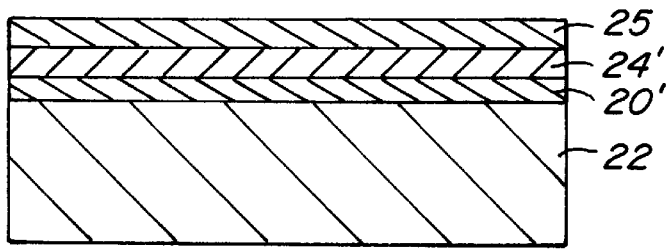
Figure 3C:
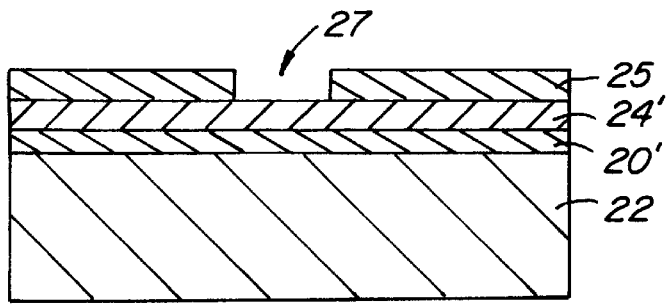
Figure 3D:
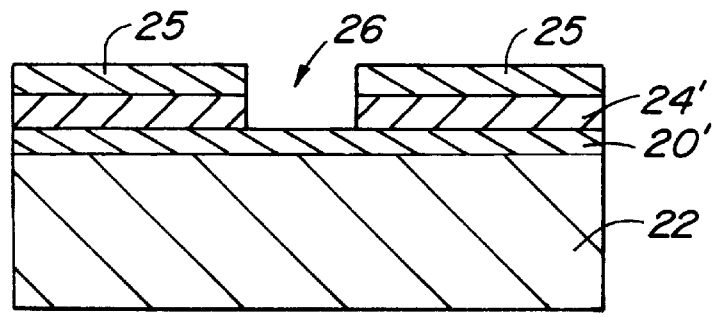
Figure 3E:
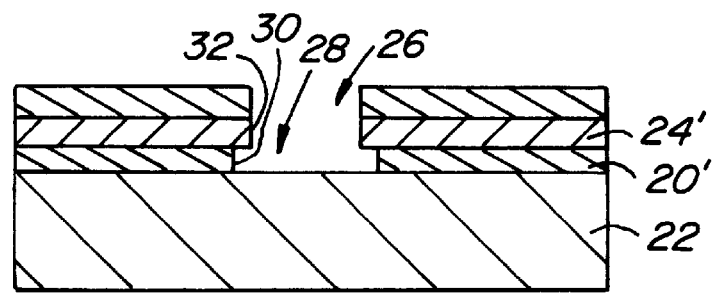
Figure 3F:
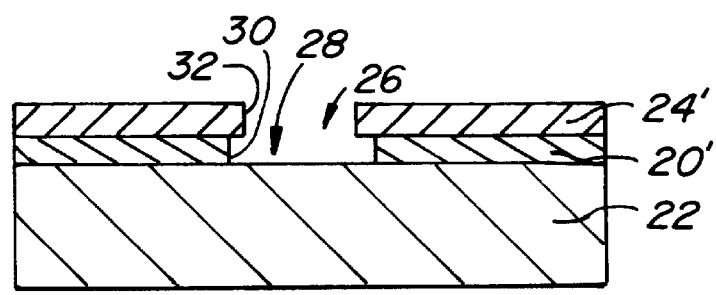

A preferred process for trench forming is shown in FIGS. 2–2f. FIGS. 3–3f show steps that can be used, instead of the steps shown in FIGS. 2–2c, to obtain the two-layer undercut mask used in the subsequent trench-forming steps shown in FIGS. 2d–2f. In FIGS. 2–2c, the second mask layer is a patternable material, and thus can be patterned to define the trench dimensions, while in FIGS. 3–3f, the second mask layer is a non-patternable material, e.g., a nitride or oxide, and thus a third mask layer of patternable material is applied to define the trench dimensions prior to etching the first and second layers.

The process steps illustrated in FIGS. 2–2f and 3–3f will be discussed in detail, followed by a discussion of the preferred materials for use in the trench-forming process and the manner of selection of appropriate materials.

Process Steps

First, as shown in FIG. 2, a first layer 20 of masking material is applied to the surface of a silicon wafer 22. Preferably, the first layer has a thickness of from about 1000 to 5000 Å, depending on the desired radius of curvature of the top corners. The thickness needed to obtain a desired radius of curvature in a particular process can be readily determined empirically.

Next, as shown in FIG. 2a, a second layer 24 of a patternable masking material, e.g., a photoresist, is applied to the surface of the first layer 20. The thickness of the second layer 24 will depend on the selectivity of the etch, masking material and depth required. The second layer 24 should generally be thick enough to withstand the trench etching process used, i.e., to resist removal long enough for the desired trench depth to be obtained. For example, to etch a 2 μm trench a thickness of about 1–2 μm is suitable for a photoresist mask layer.

The second layer 24 is then exposed through a mask to define the dimensions (length and width) of the trench, and the material of the second layer in the area where the trench is to be formed is removed, forming a first open area 26, as shown in FIG. 2b.

Thus, the length and width of this first open area 26 will define the length and width of the trench to be formed.

Then, as shown in FIG. 2c, a second open area 28 is formed in the first layer 20.

The second open area 28 has a greater length and width than the first open area 26, so that the edge 30 of the first layer 20 that surrounds the second open area 28 is "undercut" with respect to the edge 32 of the second layer 24 that surrounds the first open area 26.

This undercut will cause the top corner of the trench to be rounded during the trench etching process. Preferably, edge 32 overhangs edge 30 by at least 1000 Å, preferably from 2000 to 3000 Å. A smaller undercut may result in inadequate top corner rounding, whereas a larger undercut is generally not necessary to obtain good rounding.

The undercut of the first layer with respect to the second layer can be formed in a number of ways.

For example, the first layer can be wet-etched, i.e., etched with an etchant that etches isotropically. If this technique is used, the etchant for the wet etch is selected to remove the first layer but not the second layer, e.g., if the second layer is a photoresist and the first layer is an oxide a suitable etchant would be a hydrogen fluoride solution.

Alternatively, the first and second layer masking materials can be dry etched, i.e., selected so that they etch at different rates with the same etchant, with the first layer etching faster than the second layer. In this case, the two layers would be etched simultaneously, so that the steps shown in FIGS. 2b and 2c would be combined into a single step.

After the two mask layers and open areas have been formed, the silicon wafer is etched to form a trench 12, as shown in FIG. 2d. Preferably, reactive ion etch (RIE) is used to remove the silicon material and form the trench.

The masking materials are then removed by any suitable technique, as is well known in the semiconductor art (FIG. 2e). If desired, the bottom corner is then further rounded, and any damage resulting from the RIE is removed, by remote plasma isotropic etch (FIG. 2f).

Alternatively, the first and second layers can both be formed of non-patternable materials, e.g., oxides and nitrides. If this were the case, then the three-layer process shown in FIGS. 3–3f would replace the steps shown in FIGS. 2–2c. In this process, FIGS. 3–3a show the deposition of an first oxide masking layer 20' and a second nitride masking layer 24' onto a semiconductor substrate 22. Because neither oxide nor nitride can be patterned, e.g., exposed through a mask to remove selected portions of the layer, a further patternable masking layer 25 (e.g., a photoresist) is deposited on the surface of nitride layer 24' (see FIG. 3b). This patternable layer 25 is then exposed through a mask and a portion of the layer is removed to form an opening 27 that will define the dimensions of the trench (FIG. 3c). Layers 24' and 20' are then either wet etched, as shown in FIGS. 3d and 3e, or dry etched (FIGS. 3d and 3e combined into a single step) as described above with reference to FIGS. 2b and 2c. Finally, the patternable layer 25 is stripped (FIG. 3f), after which the two-layer mask is used to form a trench as described above with reference to FIGS. 2d–2f.

Materials

The masking materials and the etchant(s) are selected based on the etching process to be used to form the undercut. As discussed above, if wet etching is to be used, the material of the first masking layer is a material which is etchable by the wet etchant, while the second masking layer is selected to be unaffected by the wet etchant. If a single etching step is to be used, then the masking materials are chosen to have relative selectivities such that the first layer will etch more rapidly than the second layer.

If wet etching is to be used, preferably the first layer is an oxide layer formed on the surface of the silicon, the second layer is a photoresist, and the wet etchant is an etchant that wet etches the oxide layer but does not affect the photoresist, for example hydrogen fluoride a preferred etchant is a 2% solution of hydrogen fluoride. The photoresist is stripped using any conventional resist strip process.

If the two layers are to be removed in a single etching step, preferably the two layers are formed of different dielectric materials having high selectivity, for example an oxide as the first masking layer and a nitride as the second masking layer. Other combinations can be used, provided the materials can be sufficiently undercut to provide the desired degree of top corner rounding.

A suitable reactive ion combination for use in initial breakthrough step of the trench forming etch process is chlorine and argon. Once the top corners have been formed in this step, the sidewalls and bottom of the trench are formed by etching with $HBr$, $Cl_2$, and $NF_3$. Other ions can be used, for example any noble ion, provided the desired degree of bottom rounding is attained.

Trench Characteristics

Figure 1:
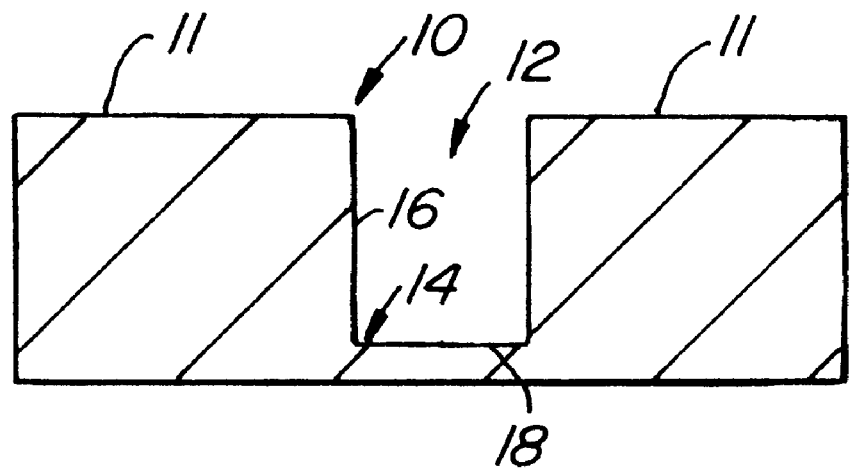
FIG. 1 is a side cross-sectional view of a trench having sharp top and bottom corners.
Figure 1A:
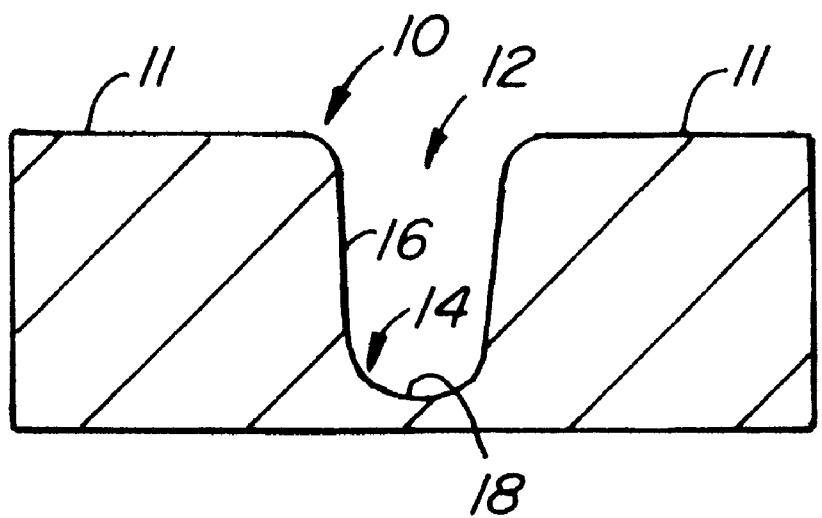
FIG. 1a is a side cross-sectional view of a trench having rounded top and bottom corners.

Preferably, trenches formed as described above will have bottom corners 14 (FIG. 11b) having a concave radius of curvature of from about 30 to 100 nm, and top corners 10 (FIG. 1b) having a convex radius of curvature of from about 30 to 100 nm.

IC Devices

Many different types of IC and memory devices can be manufactured using the trench described above. Examples of two such devices are shown in FIGS. 4 and 4a.

Figure 4:
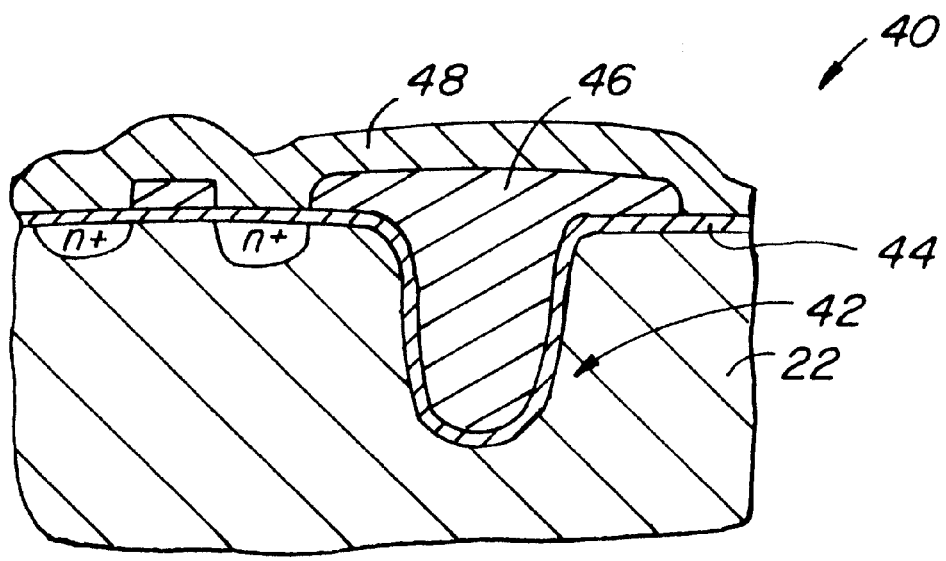
FIGS. 4 and 4a schematically show examples of IC devices manufactured using the trench shown in FIG. 2f.

FIG. 4 shows a capacitor 40 for use in a memory cell. Capacitor 40 includes a trench 42 formed in a semiconductor substrate 22. A layer of gate oxide 44 is deposited on the inside surface of the trench, after which the trench is filled with polysilicon 46. The polysilicon 46 is then covered with a dielectric layer 48.

Figure 4A:
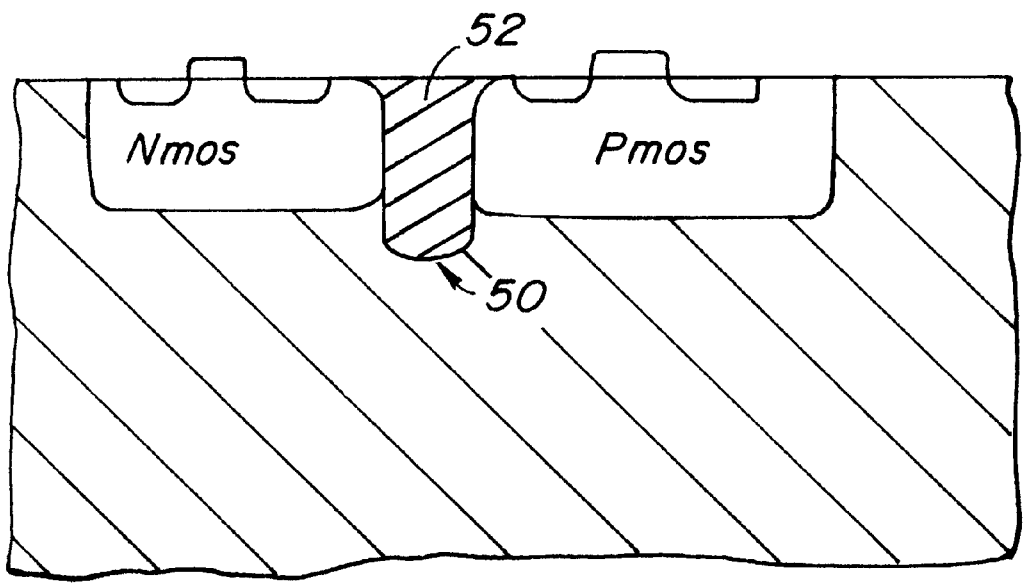

FIG. 4a shows a trench 50 that is used for isolation in an IC. To provide isolation, trench 50 is filled with a dielectric material 52.

Other embodiments are within the claims. For example, other semiconductor materials could be used, such as gallium arsenide. Also, more than two mask layers can be used, provided the two layers adjacent the substrate surface include an undercut.

What is claimed is:

1. A process for forming a trench in a semiconductor material comprising:

providing a semiconductor substrate, a masking layer directly on the surface of the semiconductor substrate, and a photoresist layer directly coating the surface of the masking layer, the photoresist layer defining a first open area and the masking layer defining a second open area larger than the first area and aligned therewith in a manner so that in the area of the openings the masking layer is undercut with respect to the photoresist layer; and removing a portion of the semiconductor substrate through the open area defined by the photoresist layer to form a trench in the semiconductor substrate.

2. The process of claim 1 wherein the masking layer material comprises an oxide.

3. The process of claim 2 wherein the masking layer is wet etched to provide the undercut.

4. The process of claim 1 further comprising forming the open areas by etching the masking and photoresist layers with a single etchant, and forming the masking and photoresist layers of materials having relative selectivities to cause the masking layer to be etched faster than the photoresist layer, thereby forming the undercut.

5. The process of claim 1 wherein the removing step is a reactive ion etch.

6. The process of claim 5 further comprising selecting chlorine and argon as ions for use in an initial breakthrough stage of the reactive ion etch.

7. The process of claim 1 further comprising removing the masking and photoresist layers after the trench is formed.

8. The process of claim 7 further comprising smoothing the surface of the trench with a remote plasma isotropic etch.

9. A method of forming a trench in a semiconductor substrate comprising:

providing a semiconductor substrate;

forming an oxide layer directly on a major surface of the substrate;

covering a major surface of the oxide layer with a photoresist layer that is formed directly on top of the oxide layer;

forming a first open area through the photoresist layer to the oxide layer surface;

etching a second open area in the oxide layer, so that the oxide layer undercuts the photoresist layer, and edges of the second open area surround edges of the first open area; and forming a trench through the open areas and into the substrate.

10. A method of forming a trench in a semiconductor substrate comprising:

providing a semiconductor substrate;

forming a masking layer directly on a major surface of the substrate;

covering the masking layer surface with a photoresist layer that is formed directly on top of the masking layer;

dry etching a first open area in the photoresist layer and a second open area in the masking layer using a single etch step, such that the second open area is undercut with respect to the edge of the photoresist layer, which surrounds the first open area.

11. The method of claim 10 wherein the masking layer material is an oxide.

* * * * *